United States Patent
Sugiyama

(10) Patent No.: US 6,219,287 B1
(45) Date of Patent: Apr. 17, 2001

(54) FAIL MEMORY CIRCUIT AND INTERLEAVE COPY METHOD OF THE SAME

(75) Inventor: Yuji Sugiyama, Kanagawa (JP)

(73) Assignee: Ando Electric Co., Ltd., Kanagawa (JP)

( * ) Notice: Subject to any disclaimer, the term of this patent is extended or adjusted under 35 U.S.C. 154(b) by 0 days.

(21) Appl. No.: 09/671,126

(22) Filed: Sep. 27, 2000

(30) Foreign Application Priority Data

Sep. 28, 1999 (JP) .................................. 11-275390

(51) Int. Cl.⁷ ..................................... G11C 7/00
(52) U.S. Cl. ............................ 365/200; 365/201; 365/194
(58) Field of Search .................................. 365/200, 201, 365/194, 230.03

(56) References Cited

U.S. PATENT DOCUMENTS 5,808,944 * 9/1998 Yoshitake et al. .................... 365/200

* cited by examiner

Primary Examiner—Huan Hoang
(74) Attorney, Agent, or Firm—Fish & Richardson P.C.

(57) ABSTRACT

The address generation circuit 10 generates the address in which the fail data is stored. The logical circuit 15 comprises: when the address is inputted, a circuit to delay the address by a predetermined constant time; a circuit to output the selection signal which is the binary level signal; and a circuit to output the signal inputted from the address generation circuit 10 or the signal inputted from the pipe line circuit, corresponding to the value of the selection signal. When the address is inputted, the memory array 16 outputs the fail data stored in the address of the memory units A –D, or writes the inputted fail data in address of the memory units A –D. The OR circuit 70 OR–operates a plurality of inputted fail data, and outputs to the memory array 16.

2 Claims, 5 Drawing Sheets

FAIL MEMORY CIRCUIT AND INTERLEAVE COPY METHOD OF THE SAME

BACKGROUND OF THE INVENTION

The present invention relates to, in a memory device test apparatus, a fail memory circuit in which the failure information (fail data) is stored, and an interleave copy method of the fail memory circuit.

In the recent memory device, in accompany with the increase of the performance of the general purpose devices, the capacity and the speed are greatly increased. In order to analyze the failure information (fail data) of a device by the device test, a fail memory circuit to store the fail data exists in a memory tester. FIG. 4 is a block diagram of the conventional fail memory circuit.

Numeral 6 is a test apparatus to test the measured device, and outputs an address of a portion in which a failure occurs, and the result of the test as the fail data to a fail memory circuit 1. Numeral 7 is a pattern generation circuit to output a test address AD. The fail memory circuit 1 stores the fail data FD inputted from the test apparatus 6 in memory units A –D in real time.

Incidentally, the fail memory circuit 1 stores the fail data FD by an interleave method so that the writing of the fail data FD is conducted at high speed. Thereby, each memory unit operates at the frequency of (test frequency/memory unit number).

Numeral 2 a memory which, when the input is received from a device selection signal generation circuit 9, is in an operating condition, and corresponding to the input signal from a writing signal generation circuit 8, the read mode/write mode is switched.

Numeral 60 is a Dout control circuit by which, when the data is inputted from a memory 2, the data is converted into a form conformable to an input of an OR circuit 70. Further, the memory units A –D are respectively the same structure. Numeral 70 is an OR circuit by which the data outputted from each Dout control circuit 60 are OR-operated. Numeral 4 is a data control circuit by which, when the data is inputted from the OR circuit 70, the data is converted into a form conformable to an input of a memory array 3.

Incidentally, in order to convert the fail data obtained by the test into the data necessary for the failure analysis of the device, the processing (interleave copy) to collect together the fail data which is processed in parallel, is necessary. Referring to FIGS. 5A and 5B, this interleave copy method will be described below. Incidentally, FIG. 5A is a simplified circuit of the fail memory circuit 1 in FIG. 4.

An address circuit 10 generates an address a1 at time t1, and outputs the address a1 as an output signal A1 to an address control circuit 5. The address control circuit 5 outputs the inputted address a1 as an output signal A2 to the memory array 3 at time t3. In this case, the address generation circuit 10 outputs the address a1 from time t1 to time t7, and according to that, the address control circuit 5 outputs the address a1 from time t3 to time t9.

The memory array 3 outputs the fail data d1–1 –dl–4 stored in the memory address al of the memory units A –D as the output signals D1–1 –D1–4 to the OR circuit 70 at time t5, when the address a1 is inputted. The OR circuit 70 OR-processes the inputted fail data d1–1 –d1–4 into the fail data d1, and outputs the fail data d1 to the data control circuit 4.

The data control circuit 4 outputs the inputted fail data d1 to the memory array 3 at time t8. The memory array 3 overwrites, when the fail data d1 is inputted, the fail data d1 on the address al of the memory units A –D. By these sequential operation, the interleave copy is conducted.

Herein, the address of each memory units A –D in which the OR-processed fail data is written, is the same as the address at the time of the reading of the fail data. Accordingly, in the above described conventional circuit, when the interleave copy is conducted, the same address is continuously outputted from the time of the reading of the fail data to the time of the writing of the OR-processed fail data into each memory unit, (from t4 to t9).

As the result, in the conventional circuit, when the necessary number of clock stages from the read mode to the write mode is N, the processing time of the following expression is necessary for the interleave copy:

(rate) ×(N +2) ×(memory capacity) [nS]

As described above, in the fail memory circuit, it is necessary that the fail data which is written by the interleave method, is OR-processed and collected together, and written into the memory unit again. In the conventional method, because during the time of transferring from read mode to write mode, the same address are continuously outputted, and thereby, the interleave copy is conducted, the processing time proportional to the number of clock stages of the circuit is necessary.

Accordingly, the increase of the capacity of the memory device and the increase of the number of fail memory circuits become a cause of the increase of the fail data processing time. In view of the foregoing problems, the present invention is attained, and the object of the present invention is to provide a fail memory circuit to suppress the processing time of the interleave copy to the minimum, and its interleave copy method.

SUMMARY OF THE INVENTION

In order to attain the above object, the invention according to the fist aspect of the present invention is as the following. A fail memory circuit in which the fail data which is the information of a fail memory obtained as a result of a device test, is stored in a plurality of memory units by an interleave method, the fail memory circuit is characterized in that, it has: an address generation circuit to generate an address in which the fail data is stored; a pipe line circuit to delay the address by a predetermined constant time, when the address generated by the address circuit is inputted; a selection signal generation circuit to generate a selection signal which is a binary level signal, and output it; a selector to select either one of the output of the address generation circuit or that of the pipe line circuit, according to the selection signal, and output it; a memory array comprising a plurality of memory units, in which, when the address is inputted from the selector, the fail data stored in the address of each memory array is outputted, or the inputted fail data is written into the address of each memory array; and an OR circuit in which a plurality of fail data inputted from the memory array are OR-calculated, and outputted to the memory array.

The invention according to the second aspect of the present invention is as the following. An interleave copy method of a fail memory circuit in which the fail data which is the information of a fail memory obtained as a result of a device test, is stored in a plurality of memory units by an interleave method, the interleave copy method of the fail memory circuit is characterized in that: the address in which the fail data is stored, is generated, and is supplied as the first address to the plurality of memory units; the address is delayed by a predetermined time and supplied to the plurality of memory units as the second address; a plurality of the fail data read from the plurality of memory units according to the first address are OR-calculated; and the data obtained by the OR-processing is written in the memory units according to the second address.

DETAILED DESCRIPTION OF THE PREFERRED EMBODIMENTS

Figure 1A:
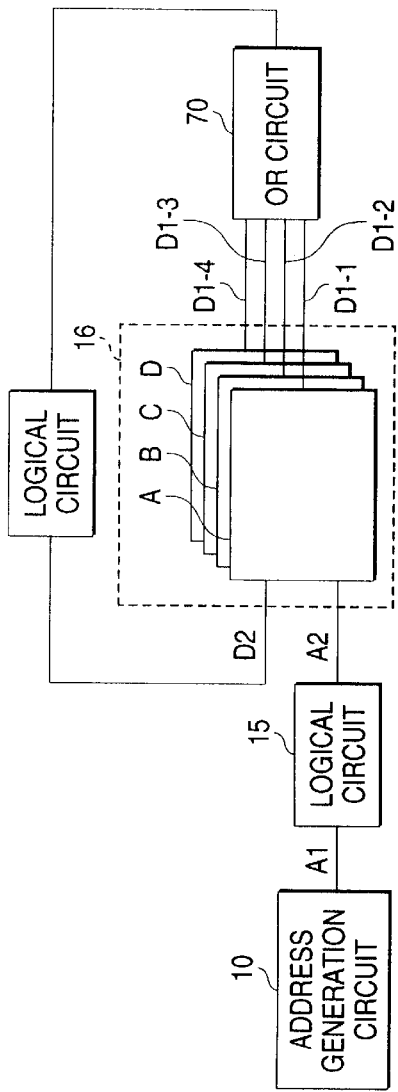
FIGS. 1A and 1B are block diagram of a fail memory circuit according to an embodiment of the present invention.

Referring to the drawings, an embodiment of the present invention will be described below. In the present embodiment, as a generation method of the address used for the interleave copy, amethod is used by which a read address which is an address of the fail data read from each memory unit, and a write address which is an address of the fail data written into each memory unit, are alternately outputted at each rate.

That is, it is different from the conventional method by which the same address is outputted from the read mode to the write mode, but is a method by which the read mode to output the read address for 1 rate, and the write mode to output the write address for 1 rate, are repeated.

Figure 1B:
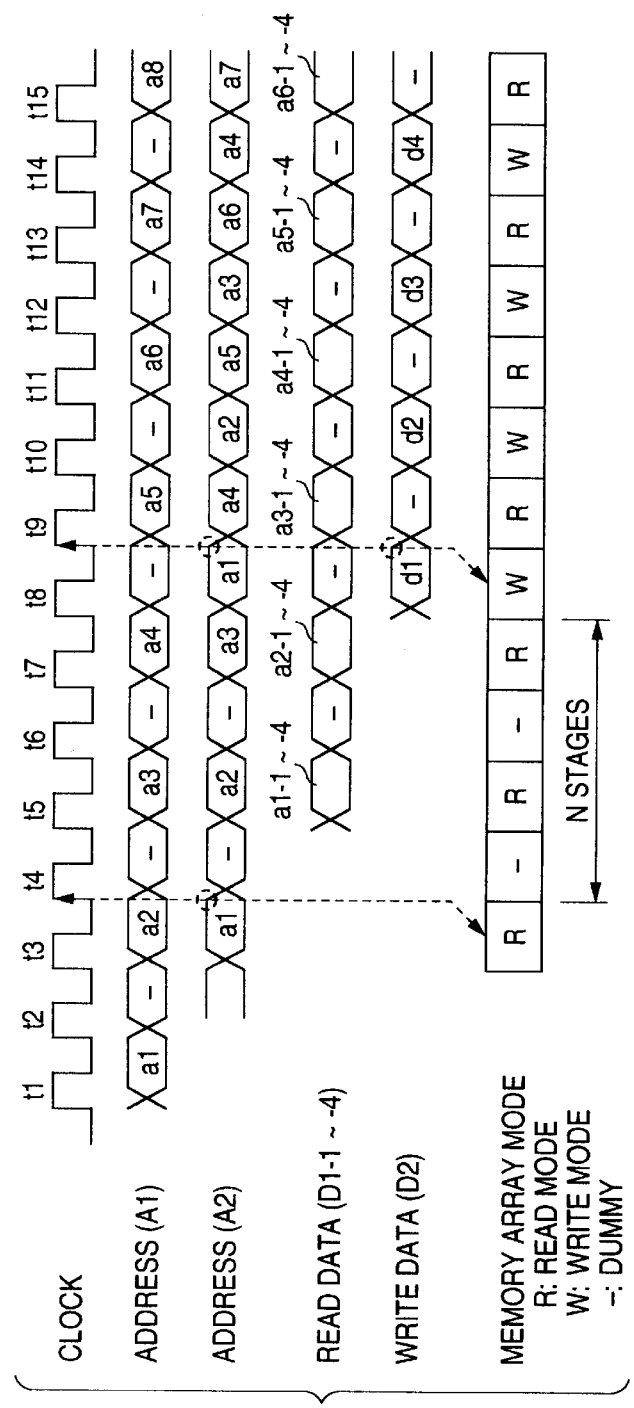

The above description will be described below according to FIG. 1A which is a fail memory circuit according to an embodiment of the present invention, and FIG. 1B which is a time chart of the fail memory circuit. FIGS. 1A is a block diagram showing the structure of the fail memory circuit according to the embodiment. In this drawing, numeral 10 is an address generation circuit to generate the address and output it to the second logical circuit 15.

When an address is inputted, the logical circuit 15 outputs the address at once, and further, outputs the address again after a predetermined time. Herein, a time period from the time when the address is outputted first, to the time when the address is outputted again, is equal to the time necessary for the processing in a memory array 16, OR circuit 70, and data control circuit 80, and in the present embodiment, this time is 5 clocks.

When the data (signal D2) is inputted from the data control circuit 80 while the address (signal A2) is inputted from the logical circuit 15, the memory array 16 becomes the write mode in which the inputted data is written in the address of the memory unit, and when the fail data (signal D2) is not inputted from the data control circuit 80 while the address (signal A2) is inputted from the logical circuit 15, the memory array 16 becomes the read mode in which the data stored in the address is outputted from the memory units A –D.

The OR circuit 70 OR-processes the output signals D1–1 –D1–4 of the memory array 16. The data control circuit 80 converts the OR-processed data into a form conformable to the memory array, and outputs the converted data to the memory array 16.

In such the structure, initially, the address generation circuit 10 generates the address a1 as the read address at time t1, and outputs the address a1 as the output signal A1 to the logical circuit 15. When the address a1 is inputted, the logical circuit 15 outputs the read address a1 as the output signal A2 to the memory array 16 at time t3. When the address a1 is inputted, the memory array 16 outputs the fail data d1–1 –d1–4 stored in the address a1 of the memory units A –D as the output signals D1–1 –D1–4 to the OR circuit 70 at time t5.

The OR circuit 70 OR-processes the inputted fail data d1–1 –d1–4 into the fail data d1 and outputs the fail data d1 to the data control circuit 80. The data control circuit 80 converts the inputted fail data d1 into a form conformable to the input of the memory array 16, and outputs the fail data d1 to the memory array 16 as the output signal D2 at time t8.

On the one hand, the logical circuit 15 outputs the address a1 as the output signal A2, which is the write address, to the memory array 16 again at time t8. Accordingly, because, into the memory array 16, the fail data d1 and write address a1 are inputted at time t8, the memory array 16 overwrites the fail data d1 in the address a1. Incidentally, at time t2, because the writing into the memory units is not conducted, the write address is a dummy address (described as –)

As described above, when the read address and the write address are generated at for each constant time, and the read mode and the write mode are alternately conducted, the processing time of the interleave copy is as follows. When the number of necessary stages of the circuit from the read mode to the write mode is N stages, (rate) ×2×(memory capacity) +N/2 [nS] Herein, N/2 shows the cycle to output the address of the dummy.

As described above, when the influence in which the number N of necessary stages of the circuit from the read mode to the write mode affects the interleave copy processing time, is compared to the conventional circuit, in the conventional circuit, it influences by the multiplication, but in the present invention, it influences by the addition. Accordingly, according to the present invention, the processing time of the interleave copy can be reduced.

Figure 2:
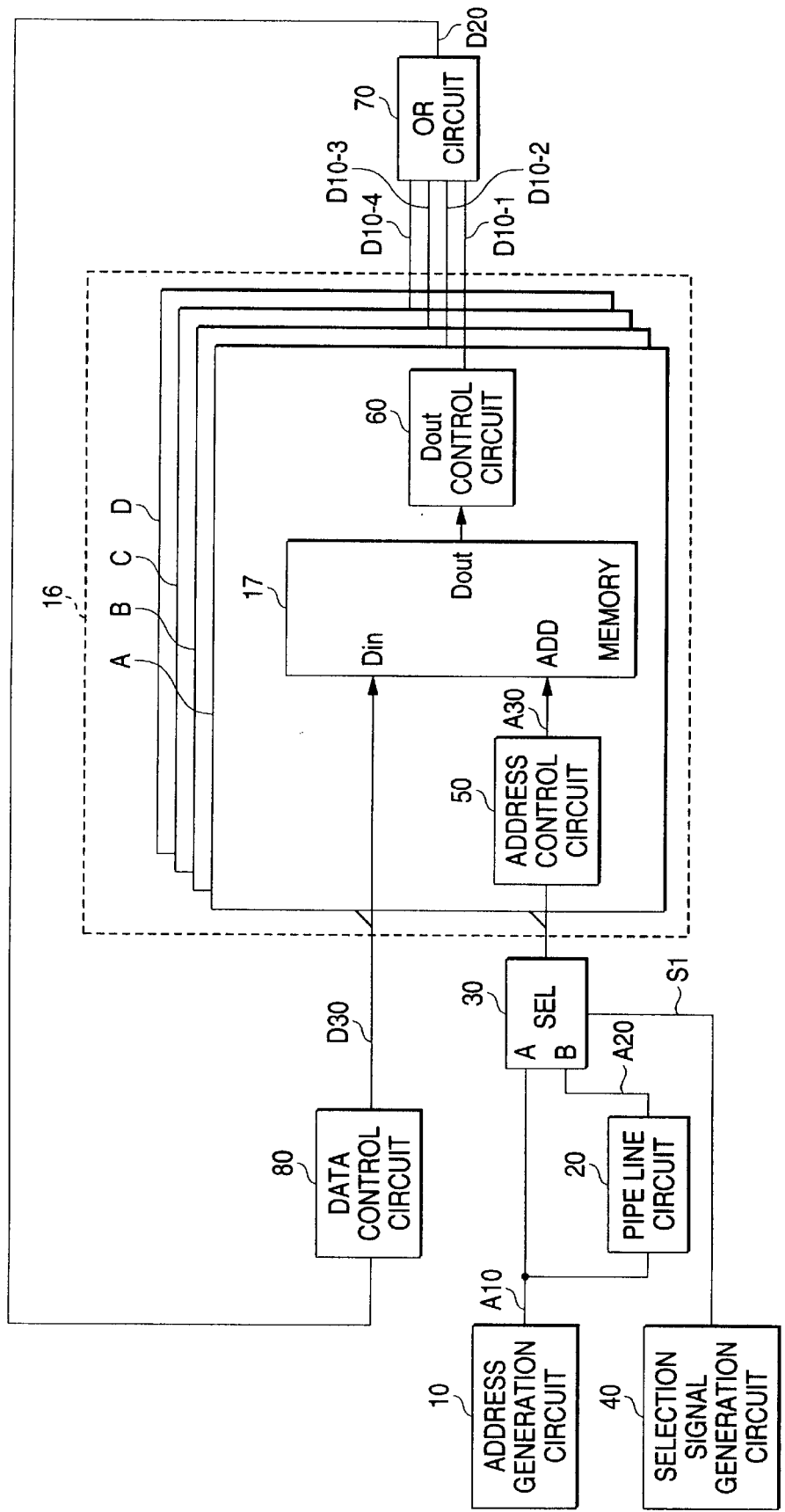
FIG. 2 is a block diagram of a fail memory circuit according to another embodiment of the present invention.
Figure 3:
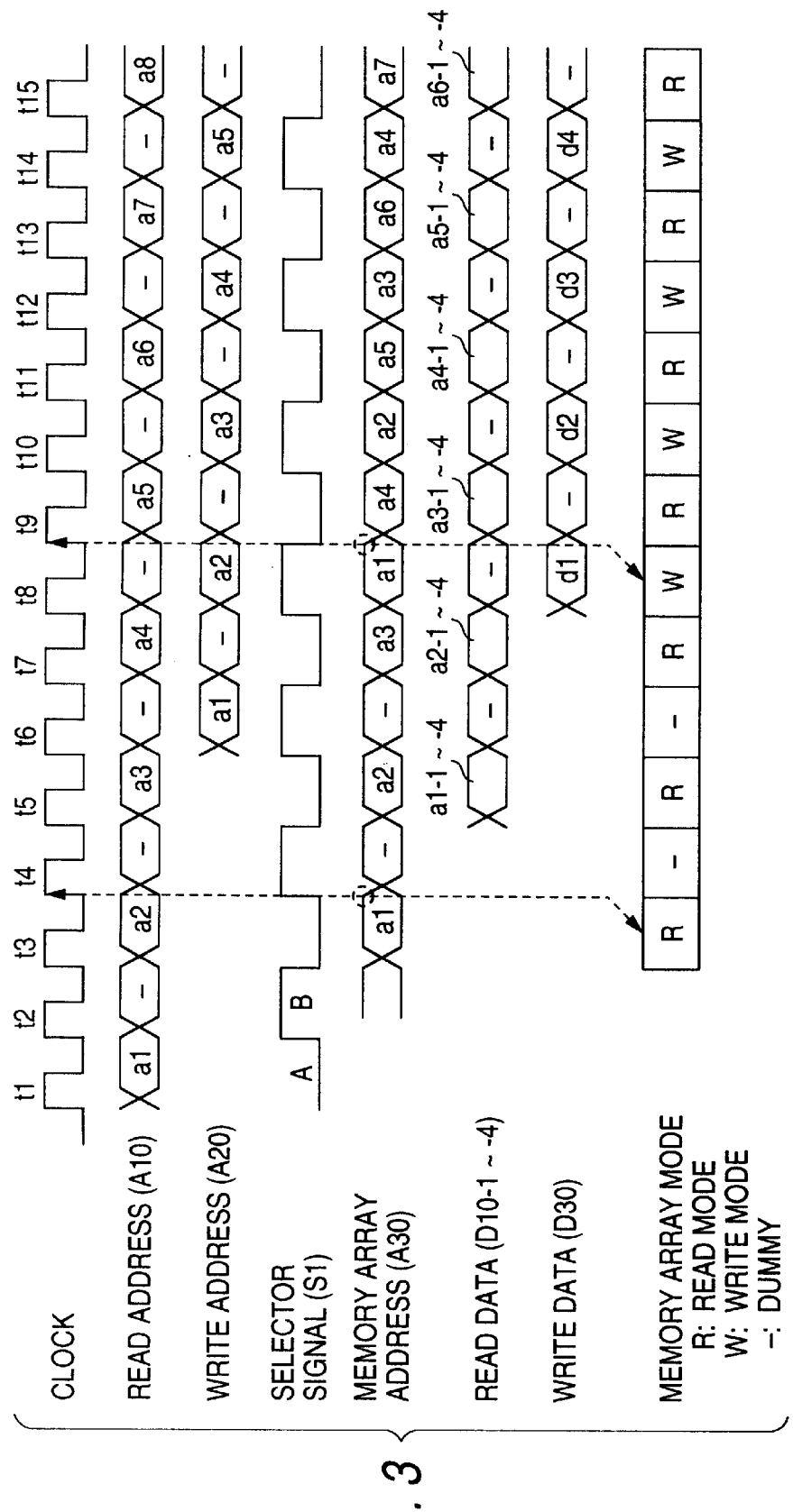
FIG. 3 is a time chart of a fail memory circuit according to another embodiment of the present invention.
Figure 4:
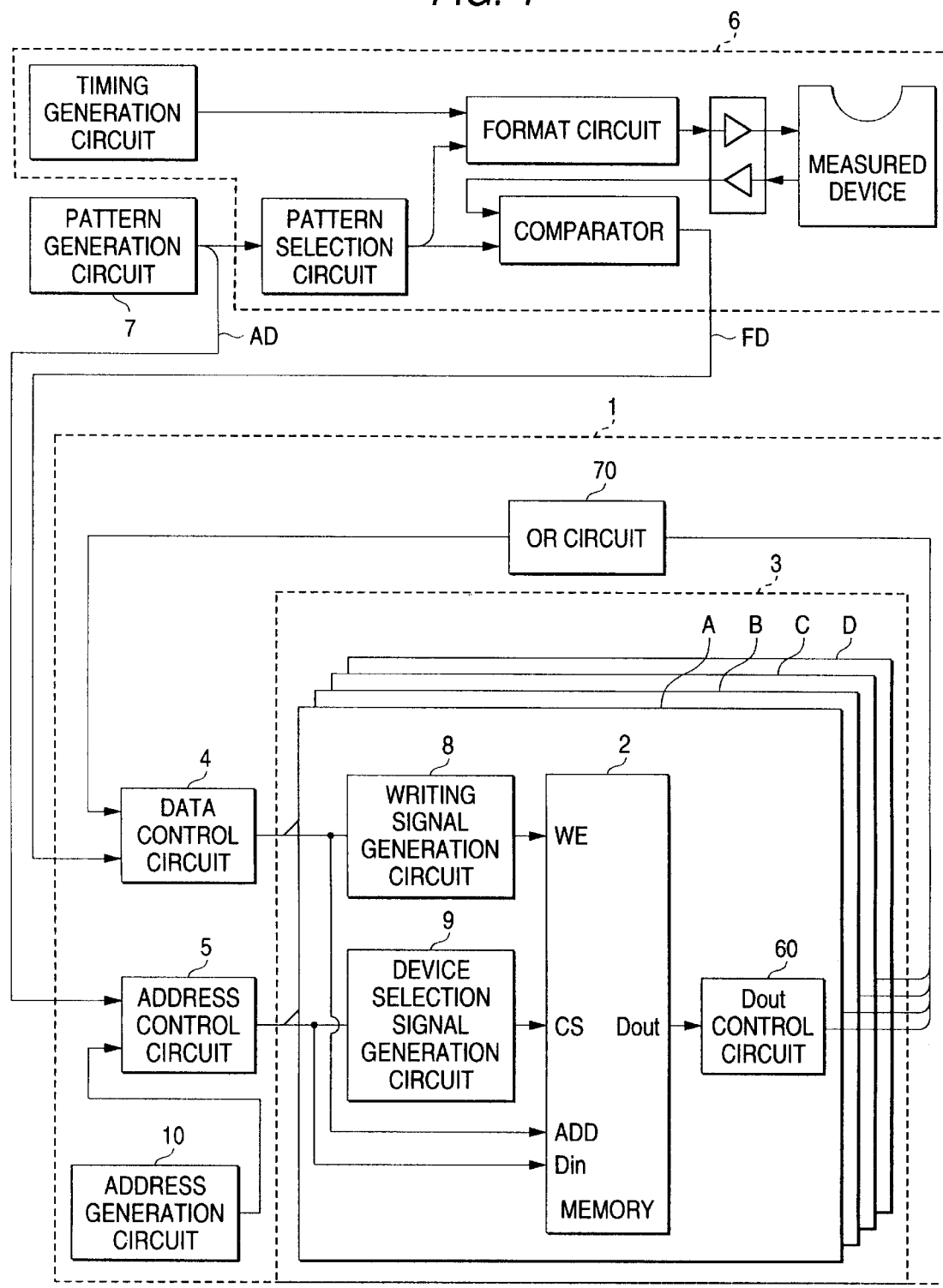
FIG. 4 is a block diagram of the conventional fail memory circuit.
Figure 5A:
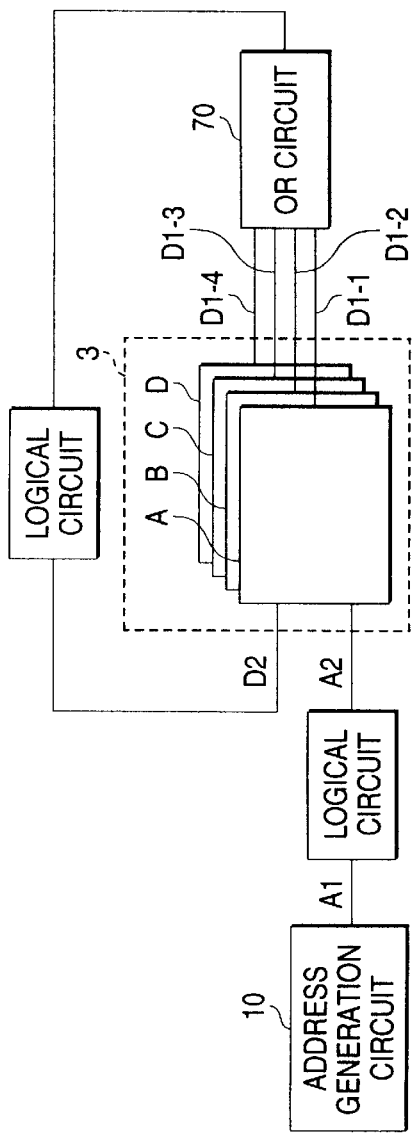
FIGS. 5A and 5B are block diagram and a time chart of the conventional fail memory circuit.
Figure 5B:
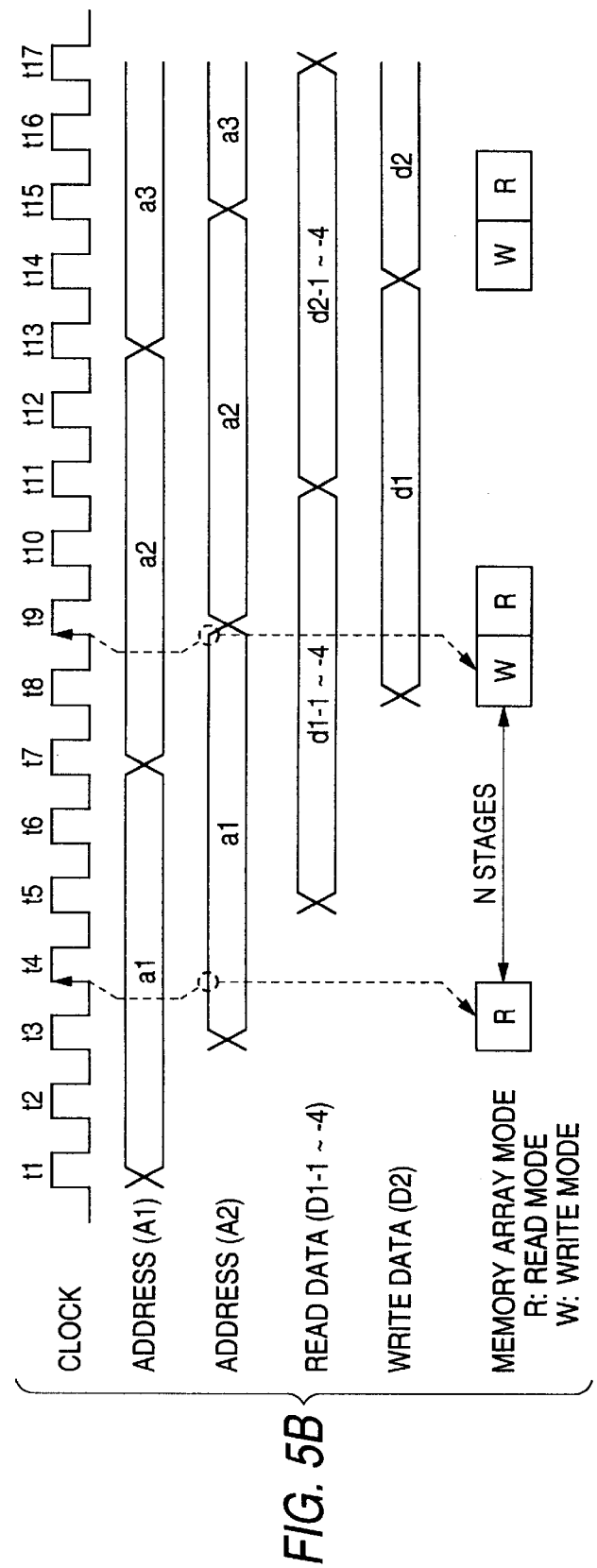

Next, the circuit structure to realize the interleave copy method according to another embodiment of the present invention is shown in FIG. 2, and its time chart is shown in FIG. 3. Incidentally, in FIG. 2, the same part as each part FIG. 1 is denoted by the same numeral and sign.

Numeral 20 is a pipe line circuit by which the address inputted from the address generation circuit 10 is delayed by the number of necessary stages. In the pipe line circuit 20, the number of stages to be delayed is the number of clock stages which is necessary for the time period from the time when the read address is given to the memory array 16 to the time when the OR-processed fail data is written. That is, when the number of clock stages of X is necessary for the processing of the address control circuit 50, Dout control circuit 60, and data control circuit 80, the pipe line circuit 20 shifts the inputted data for X stages.

Numeral 30 is a selector which, when the inputted selection signal S1 is "L (Low)", outputs the signal A10 inputted from the address generation circuit 10, and when the inputted selection signal S1 is "H (High)", outputs the signal A20 inputted from the pipe line circuit 20.

The selection signal generation circuit 40 outputs the selection signal S1 which alternately outputs "L" and "H" for each 1 clock, to the selector 30. The address control circuit 50 converts the inputted address into a form conformable to the input of the memory 17, and outputs the converted address to the memory 17. The Dout control circuit 60 converts the inputted data into a form conformable to the input of the OR circuit 70, and outputs the data after conversion to the OR circuit 70. Further, the memory units A –D are the same structure.

Next, the operation of the fail memory circuit according to the above structure will be described. The address generation circuit 10 generates the address a1 as the read address at time t1 shown in FIG. 3, and outputs it to the pipe line circuit 20 and the selector 30 as the output signal A10. Because th selection signal S1 is "L", the selector 30 selects A (input from the address generation circuit 10) at time t1 and reads in the address a1, and outputs it to the address control circuit 50. The address control circuit 50 converts the inputted address a1 into a form conformable to the input of the memory 17, and outputs it to the memory 17 as the output signal A3 at time t3.

When the address a1 is inputted, the memory 17 outputs the fail data d1–1 –d1–4 stored in the address a1 of the memory units A –D to the Dout control circuit 60 at time t5. The Dout control circuit 60 converts the fail data d1–1 –d1–4 into a form conformable to the input of the OR circuit 70, and outputs the fail data d1–1 –d1–4 after the conversion to the OR circuit 70 as the output signal D10–1 –D10–4.

The OR circuit 70 OR-processes the inputted fail data d1–1 –d1–4 into the fail data d1, and outputs it to the data control circuit 80 as the output signal D20. The data control circuit 80 converts the inputted fail data into a form conformable to the input of the memory 17, and outputs the converted fail data d1 to the memory 17 as the output signal D30 at time t8.

On the one hand, the pipe line circuit 20 outputs the address a1 to the selector 30 as the write address at time t6. Because the selection signal S1 is "H", the selector 30 selects B (input from the pipe line circuit 20) at time t6, and reads-in the address a1, and outputs it to the address control circuit 50. The address control circuit 50 converts the inputted address a1 into a form conformable to the input of the memory 17, and outputs the converted write address a1 to the memory 17 as the output signal A30 at time t8.

Accordingly, because the fail data d1 and the write address a1 are inputted at time t8, the memory 17 overwrites the fail data d1 in the address a1 of the memory units A –D. As described above, referring to the drawings, the embodiment of the present invention is detailed, however, in the present invention, of course, not only the above embodiment, but designs and modifications within the scope which is not out of the sprit of the present invention, are also included.

As described above, according to the present invention, even when the number of stages of the fail memory circuit is increased, the effect can be obtained in which the interleave copy can be conducted in the minimum processing time.

What is claimed is:

1. A fail memory circuit in which the fail data which is the informationofa fail memory obtained as a resultof a device test, is stored in a plurality of memory units by an interleave method, comprising:

an address generation circuit to generate an address in which the fail data is stored;

a pipe line circuit to delay the address by a predetermined constant time, when the address generated by said address circuit is inputted;

a selection signal generation circuit to. generate a selection signal which is a binary level signal, and output thereof;

a selector to select either one of the output of said address generation circuit or that of said pipe line circuit, according to the selection signal, and output thereof;

a memory array including a plurality of memory units, in which, when the address is inputted from said selector, the fail data stored in the address of each memory unit is outputted, or the inputted fail data is written into the address of each memory unit; and an OR circuit in which a plurality of fail data inputted from said memory array are OR-calculated, and outputted to said memory array.

2. An interleave copy method of a fail memory circuit in which the fail data which is the information of a fail memory obtained as a result of a device test, is stored in a plurality of memory units by an interleave method, comprising the steps of:

generating an address in which the fail data is stored;

supplying the address as the first address to said plurality of memory units;

delaying the address by a predetermined time;

supplying the delayed address to said plurality of memory units as the second address;

OR-calculating a plurality of the fail data read from said plurality of memory units according to the first address; and writing the data obtained by the OR-processing in said memory units according to the second address.

* * * * *